United States Patent
Li et al.

(10) Patent No.: US 11,075,517 B2
(45) Date of Patent: Jul. 27, 2021

(54) RAPID SHORT-CIRCUIT PROTECTION CIRCUIT OF CHARGER AT OUTPUT END AND BATTERY CHARGER

(71) Applicants: SHENZHEN CLICK TECHNOLOGY CO., LTD., Guangdong (CN); CLICK TECHNOLOGY (XINFENG) CO., LTD., Jiangxi (CN); HUIZHOU CITY CLICK TECHNOLOGY CO., LTD., Guangdong (CN)

(72) Inventors: Tongcheng Li, Guangdong (CN); Mingliang Zhou, Guangdong (CN)

(73) Assignees: SHENZHEN CLICK TECHNOLOGY CO., LTD., Guangdong (CN); CLICK TECHNOLOGY (XINFENG) CO., LTD., Jiangxi (CN); HUIZHOU CITY CLICK TECHNOLOGY CO., LTD., Guangdong (CN)

( * ) Notice: Subject to any disclaimer, the term of this patent is extended or adjusted under 35 U.S.C. 154(b) by 16 days.

(21) Appl. No.: 16/802,510

(22) Filed: Feb. 26, 2020

(65) Prior Publication Data
US 2020/0259325 A1 Aug. 13, 2020

Related U.S. Application Data

(63) Continuation of application No. PCT/CN2017/113003, filed on Nov. 27, 2017.

(30) Foreign Application Priority Data

Aug. 30, 2017 (CN) .......................... 201710762632.5

(51) Int. Cl.
*H02H 9/02* (2006.01)
*H02J 7/00* (2006.01)

(52) U.S. Cl.
CPC ........... *H02H 9/025* (2013.01); *H02J 7/0031* (2013.01); *H02J 7/00041* (2020.01)

(58) Field of Classification Search
CPC ..... H02H 9/025; H02J 7/00041; H02J 7/0031
USPC ........................................................ 361/93.9
See application file for complete search history.

(56) References Cited

U.S. PATENT DOCUMENTS

| | | | |
|---|---|---|---|
| 6,501,248 B2 * | 12/2002 | Fujiwara | H02J 7/0031 320/136 |
| 7,336,054 B2 * | 2/2008 | Crisp | H02J 7/0029 320/106 |
| 7,508,171 B2 * | 3/2009 | Carrier | H01M 10/488 320/138 |
| 9,876,377 B2 * | 1/2018 | Imaizumi | H01M 10/425 |

(Continued)

FOREIGN PATENT DOCUMENTS

| CN | 204967258 | 1/2016 |
|---|---|---|
| CN | 205829231 | 12/2016 |

(Continued)

*Primary Examiner* — Yemane Mehari
(74) *Attorney, Agent, or Firm* — Winston Hsu

(57) ABSTRACT

Disclosed is a rapid short-circuit protection circuit of charger at output end. With the short-circuit protection circuit adopted at an output end of a battery charger, MOS switch transistors in a battery power supply circuit may not burn out when an output end VOUT of the battery charger is short-circuited, and thus a good short-circuit protection effect is rendered.

9 Claims, 3 Drawing Sheets

(56) References Cited

U.S. PATENT DOCUMENTS

2017/0170653 A1* 6/2017 Song .................... H02J 7/00306
2020/0259325 A1* 8/2020 Li .......................... H02J 7/0031
2020/0274375 A1* 8/2020 Griffiths ................ H02J 7/1423

FOREIGN PATENT DOCUMENTS

| CN | 107394851 | 11/2017 |
| CN | 207218305 | 4/2018 |
| GB | 1422813 | 1/1976 |

* cited by examiner

RAPID SHORT-CIRCUIT PROTECTION CIRCUIT OF CHARGER AT OUTPUT END AND BATTERY CHARGER

CROSS REFERENCE TO RELATED APPLICATIONS

This application is a continuation of PCT Application No. PCT/CN2017/113003 filed on 2017 Nov. 27, the entire contents of which are incorporated herein by reference.

BACKGROUND OF THE INVENTION

1. Field of the Invention

The invention relates to a battery charger, in particular to a short-circuit protection circuit of a circuitry of the battery charger.

2. Description of the Related Art

A circuitry of a lead-acid battery charger is used in the fields of UPS/EPS, emergency lamps, electric toys/electric tools, control systems, communication, medical treatment and the like. FIG. 1 is a diagram of a typical main circuit of a lead-acid battery charger, and the entire circuitry comprises an EMI filter, a delay protection switch circuit, a rectification filter circuit, an input voltage protection circuit, a PFC circuit, a PWM circuit, a PWM and PFC control circuit, a transformer, a 12V/24V output control circuit, a rectification filter circuit, a feedback circuit, a DC output control circuit, a charging control circuit, a battery power supply circuit, a central processing unit (CPU), a 12V/24V output control switch, an input voltage detection circuit, an output voltage detection circuit, a battery voltage detection circuit, and a battery power supply mode detection circuit, etc.

As shown in FIG. 3, without the short-circuit protection circuit 100 in the battery power supply circuit, if there is no voltage at an output end VOUT, a drain of a MOS switch transistor Q27 is at a low potential with respect to a battery connected with a battery terminal CN4, a source of the MOS switch transistor Q27 is connected with a source of a MOS switch transistor Q29, and grids of the MOS switch transistor Q27 and the MOS switch transistor Q29 are connected with a drain of a MOS switch transistor Q31 through a resistor R86; if the central processing unit detects that there is no voltage at an output end VOUT, the battery voltage protection control end DIS CTL outputs a voltage to turn on a MOS switch transistor Q31, then the MOS switch transistor Q27 and the MOS switch transistor Q29 are turned on, and the battery connected with the battery terminal CN4 supplies power to the output terminal VOUT battery terminal CN4. In use, when the output end VOUT is short-circuited, the output end VOUT is at a low potential, the circuit is powered by the battery connected with the battery terminal CN4, as a monitored voltage of the battery voltage protection control end DIS CTL of the central processing unit turns on the MOS switch transistors Q27, Q31 and Q29 as a driving signal voltage, the MOS switch transistors Q27 and Q29 can be regarded as short-circuited, and therefore the MOS switch transistors Q27 and Q29 are easy to burn out.

SUMMARY OF THE INVENTION

It's an object of the invention to overcome the disadvantages of the prior art by providing a short-circuit rapid protection circuit for a battery charger to avoid burning out a MOS switch transistor in a battery power supply circuit.

It's another object of the invention to provide a battery charger having the short-circuit protection circuit.

The following technical solutions are implemented by the invention to achieve the above objects: a short-circuit protection circuit for a battery charger, the battery charger comprises a battery power supply circuit, the battery power supply circuit comprises a first MOS switch transistor, a second MOS switch transistor, a third MOS switch transistor and a battery terminal, wherein a drain of the first MOS switch transistor is connected with a voltage output end VOUT of the battery charger, a source of the first MOS switch transistor is connected with a source of the second MOS switch transistor, grids of the first MOS switch transistor and the second MOS switch transistor are coupled to a drain of the third MOS switch transistor, a grid of the third MOS switch transistor is coupled to a battery voltage protection control end of a central processing unit of the battery charger, a source of the third MOS switch transistor is grounded, and the battery terminal is connected into a battery;

wherein the short-circuit protection circuit comprises a first diode, a second diode, a third diode, a first triode, a second triode, a third triode and a fourth MOS switch transistor, wherein the drain of the first MOS switch transistor is connected with a cathode of the first diode, an anode of the first diode is connected with an emitter of the first triode and a collector of the second triode, a base of the first triode is coupled to the battery voltage protection control end of the central processing unit, a collector of the first triode is connected with a base of the second triode, an emitter of the second triode is coupled to a base of the third triode, a collector of the third triode is connected with anodes of the second diode and the third diode, an cathode of the second diode is connected with grids of the second MOS switch transistor and the first MOS switch transistor, a drain of the second MOS switch transistor and an emitter of the third triode are connected with a positive electrode of the battery terminal, a cathode of the third diode is coupled to a grid of the fourth MOS switch transistor, a drain of the fourth MOS switch transistor is connected with a grid of the third MOS switch transistor, and a source of the fourth MOS switch transistor is grounded.

Further, the grids of the first MOS switch transistor and the second MOS switch transistor are connected with the drain of the third MOS switch transistor through a second resistor, the grid of the first MOS switch transistor is connected with the source of the first MOS switch transistor through a third resistor, and the grid of the second MOS switch transistor is connected with the source of the second MOS switch transistor through a stabilivolt.

Further, the grid of the third MOS switch transistor and the drain of the fourth MOS switch transistor are connected with the battery voltage protection control end of the central processing unit through a first resistor, and the grid of the third MOS switch transistor is connected with the source of the third MOS switch transistor through a fourth resistor.

Further, the base of the first triode is connected with the battery voltage protection control end of the central processing unit through a fifth resistor.

Further, the base of the second triode is connected with the emitter of the second triode through a sixth resistor, the emitter of the second triode is connected with the base of the third triode through a seventh resistor, and the base of the third triode is connected with the emitter of the third triode through an eighth resistor.

Further, the cathode of the third diode is connected with the grid of the fourth MOS switch transistor through a ninth resistor, and is connected with the source of the fourth MOS switch transistor through a first capacitor and a tenth resistor which are connected in parallel.

Further, the drain of the second MOS switch transistor and the emitter of the third triode are connected with the positive electrode of the battery terminal through a PTC fuse.

A battery charger comprises a battery power supply circuit, the battery power supply circuit comprises a first MOS switch transistor, a second MOS switch transistor, a third MOS switch transistor and a battery terminal, wherein a drain of the first MOS switch transistor is connected with a voltage output end VOUT, and a source of the first MOS switch transistor is connected with a source of the second MOS switch transistor, grids of the first MOS switch transistor and the second MOS switch transistor are coupled to a drain of the third MOS switch transistor, a grid of the third MOS switch transistor is coupled to a battery voltage protection control end of a central processing unit, a source of the third MOS switch transistor is grounded, and the battery terminal is connected into a battery; and the battery charger further comprises the short-circuit protection circuit.

Further, the battery charger is a lead-acid battery charger.

With the short-circuit protection circuit adopted at the direct-current output end of the battery charger, the MOS switch transistors in the battery power supply circuit may not burn out when the output end VOUT of the battery charger is short-circuited, and thus a good short-circuit protection effect is rendered.

These and other objectives of the present invention will no doubt become obvious to those of ordinary skill in the art after reading the following detailed description of the preferred embodiment that is illustrated in the various figures and drawings.

DETAILED DESCRIPTION

The invention will now be described in further detail, by way of embodiments, with reference to the accompanying drawings. It should be noted that the following description is exemplary only and is not intended to limit the scope of the invention and its application. Those skilled in the art will appreciate that the conception and specific embodiments disclosed may be readily utilized as a basis for modifying or designing other structures for carrying out the same purposes as the present invention. Those skilled in the art will also recognize that such equivalent structures do not depart from the spirit and scope of the invention. Structures and methods of operation of the novel features which are believed to be characteristics of the invention, together with further objects and advantages, will be better understood from the following description taken in conjunction with the accompanying drawings. It should be expressly understood, however, that each feature is provided for the purpose of illustration and description only and is not intended to limit the definition of the invention.

Figure 1:
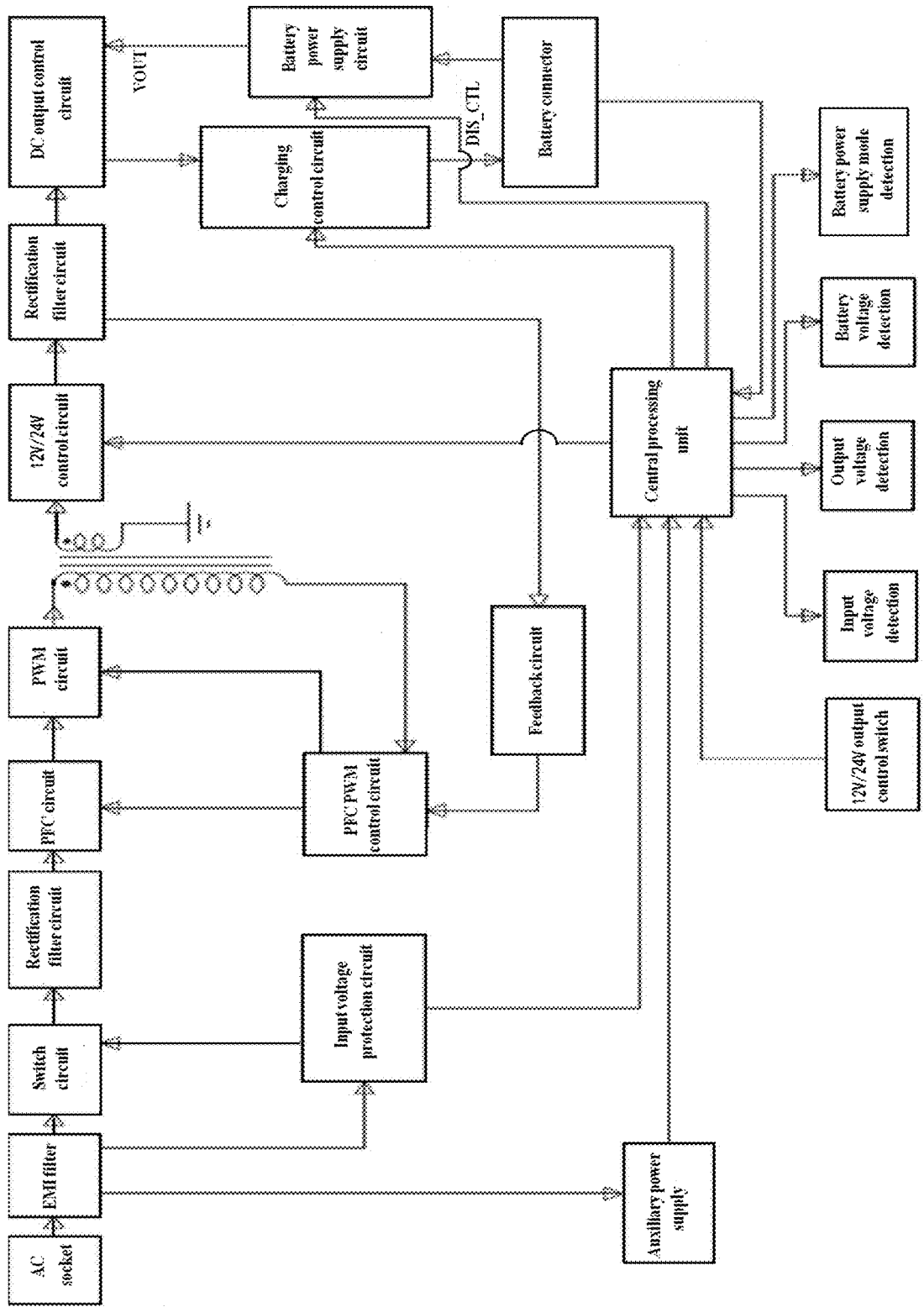
FIG. 1 is an exemplary diagram of a main circuit of a circuitry of a lead-acid battery charger.
Figure 2:
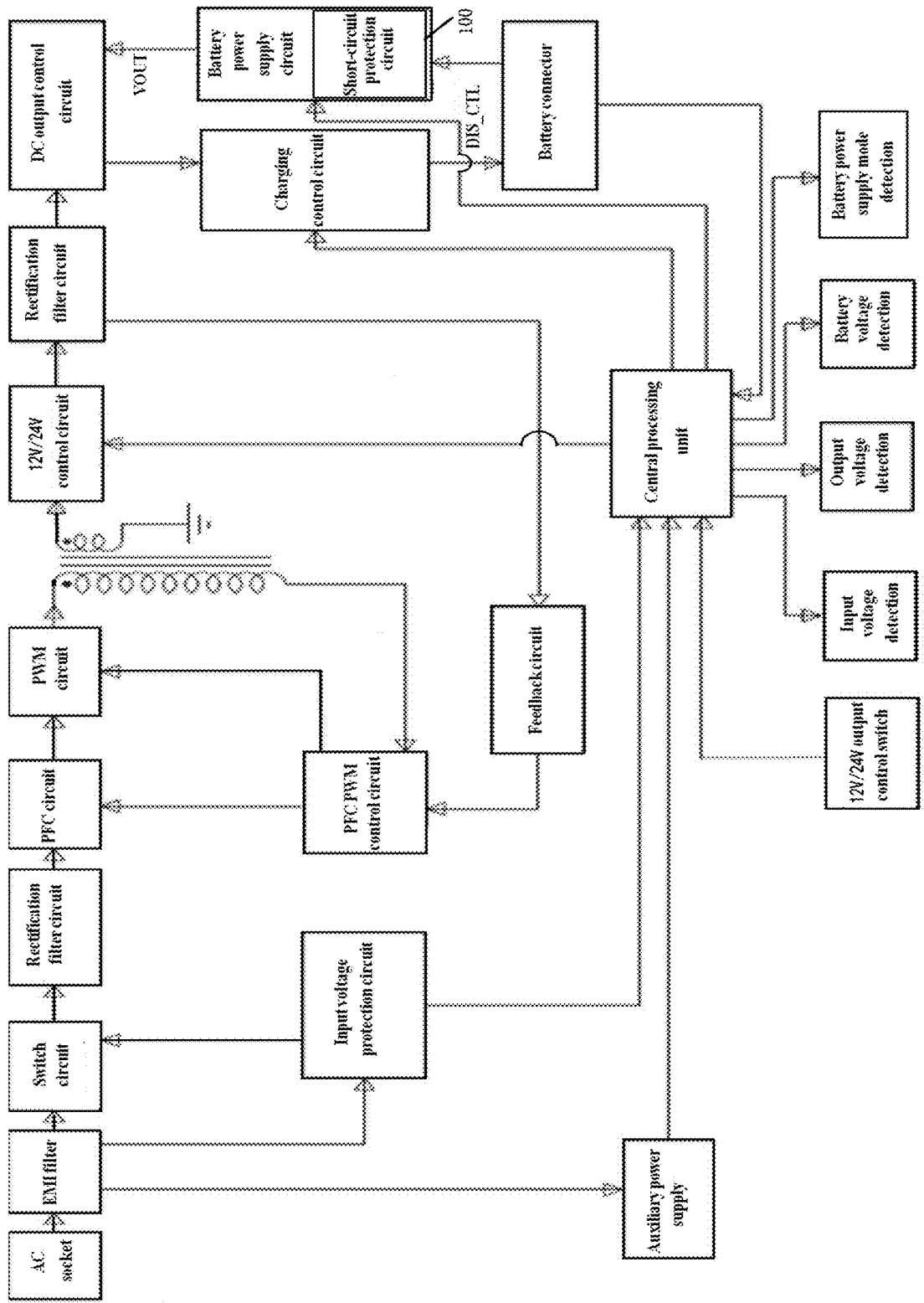
FIG. 2 illustrates the circuitry of the battery charger having a short-circuit protection circuit according to an embodiment of the invention.
Figure 3:
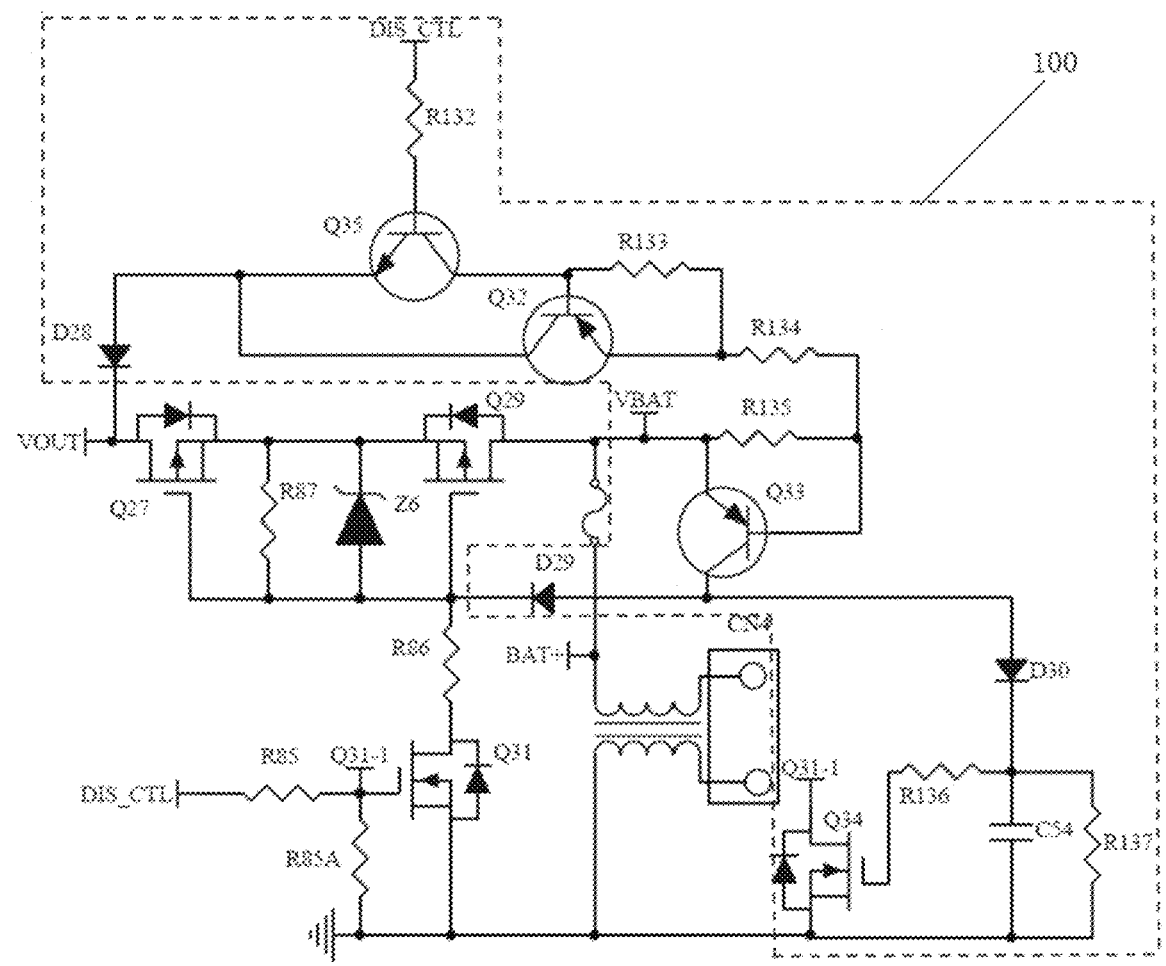
FIG. 3 is a schematic view showing a structure of the battery power supply circuit and the short-circuit protection circuit according to an embodiment of the invention, in which a portion framed by dotted lines is the short-circuit protection circuit.

With reference to FIGS. 2 and 3, in one embodiment, a battery charger includes a battery power supply circuit including a first MOS switch transistor Q27, a second MOS switch transistor Q29, a third MOS switch transistor Q31 and a battery terminal CN4, wherein a drain of the first MOS switch transistor Q27 is connected with a voltage output end VOUT, a source of the first MOS switch transistor Q27 is connected with a source of the second MOS switch transistor Q29, grids of the first MOS switch transistor Q27 and the second MOS switch transistor Q29 are coupled to a drain of the third MOS switch transistor Q31, a grid of the third MOS switch transistor Q31 is coupled to a battery voltage protection control end DIS CTL of the central processing unit, a source of the third MOS switch transistor Q31 is grounded, and the battery terminal CN4 is connected into a battery. As shown in FIG. 3, the short-circuit protection circuit of the embodiment of the invention includes a first diode D28, a second diode D29, a third diode D30, a first triode Q35, a second triode Q32, a third triode Q33 and a fourth MOS switch transistor Q34, wherein the drain of the first MOS switch transistor Q27 is connected with a cathode of the first diode D28, an anode of the first diode D28 is connected with an emitter of the first triode Q35 and a collector of the second triode Q32, a base of the first triode Q35 is coupled to the battery voltage protection control end DIS CTL of the central processing unit, a collector of the first triode Q35 is connected with a base of the second triode Q32, an emitter of the second triode Q32 is coupled to a base of the third triode Q33, a collector of the third triode Q33 is connected with anodes of the second diode D29 and the third diode D30, an cathode of the second diode D29 is connected with grids of the second MOS switch transistor Q29 and the first MOS switch transistor Q27, a drain of the second MOS switch transistor Q29 and an emitter of the third triode Q33 are connected with a positive electrode BAT+ of the battery terminal, a cathode of the third diode D30 is coupled to a grid of the fourth MOS switch transistor Q34, a drain of the fourth MOS switch transistor Q34 is connected with a grid of the third MOS switch transistor Q31, and a source of the fourth MOS switch transistor Q34 is grounded.

As shown in FIG. 3, in a preferred embodiment, the grids of the first MOS switch transistor Q27 and the second MOS switch transistor Q29 are connected with the drain of the third MOS switch transistor Q31 through a second resistor R86, the grid of the first MOS switch transistor Q27 is connected with the source of the first MOS switch transistor Q27 through a third resistor R87, and the grid of the second MOS switch transistor Q29 is connected with the source of the second MOS switch transistor Q29 through a stabilivolt Z6.

As shown in FIG. 3, in a preferred embodiment, the grid of the third MOS switch transistor Q31 and the drain of the fourth MOS switch transistor Q34 are connected with the battery voltage protection control end DIS CTL of the central processing unit through a first resistor R85, and the grid of the third MOS switch transistor Q31 is connected with the source of the third MOS switch transistor Q31 through a fourth resistor R85A.

As shown in FIG. 3, in a preferred embodiment, the base of the first transistor Q35 is connected with the battery voltage protection control end of the central processing unit through a fifth resistor R132.

As shown in FIG. 3, in a preferred embodiment, the base of the second triode Q32 is connected with the emitter of the second triode Q32 through a sixth resistor R133, the emitter of the second triode Q32 is connected with the base of the third triode Q33 through a seventh resistor R134, and the base of the third triode Q33 is connected with the emitter of the third triode Q33 through an eighth resistor R135.

As shown in FIG. 3, in a preferred embodiment, the cathode of the third diode D30 is connected with the grid of the fourth MOS switch transistor Q34 through a ninth resistor R136, and is connected with the source of the fourth MOS switch transistor Q34 through a tenth resistor R137 and a first capacitor C54 which are connected in parallel. In this embodiment, the first capacitor C54 and the tenth resistor R137 constitute an integrating circuit.

As shown in FIG. 3, in a preferred embodiment, the drain of the second MOS switch transistor Q29 and the emitter of the third triode Q33 are connected with the positive electrode BAT+ of the battery terminal CN4 through a PTC fuse.

In another embodiment, a battery charger includes a battery power supply circuit, and the battery power supply circuit includes a first MOS switch transistor Q27, a second MOS switch transistor Q29, a third MOS switch transistor Q31 and a battery terminal CN4, wherein a drain of the first MOS switch transistor Q27 is connected with a voltage output end VOUT, and a source of the first MOS switch transistor Q27 is connected with a source of the second MOS switch transistor Q29, grids of the first MOS switch transistor Q27 and the second MOS switch transistor Q29 are coupled to a drain of the third MOS switch transistor Q31, a grid of the third MOS switch transistor Q31 is coupled to a battery voltage protection control end DIS CTL of a central processing unit, a source of the third MOS switch transistor Q31 is grounded, and the battery terminal CN4 is connected into a battery; and the battery charger further includes the short-circuit protection circuit according to any of the preceding embodiments.

The battery charger may be, but is not limited to, a lead-acid battery charger.

As shown in FIG. 2, in a typical embodiment, the battery charger may include an EMI filter, a delay protection switch circuit, a rectification filter circuit, an input voltage protection circuit, a PFC circuit, a PWM circuit, a PWM and PFC control circuit, a transformer, a 12V/24V output control circuit, a rectification filter circuit, a feedback circuit, a DC output control circuit, a charging control circuit, a battery power supply circuit, a central processing unit (CPU), a 12V/24V output control switch, an input voltage detection circuit, an output voltage detection circuit, a battery voltage detection circuit, and a battery power supply mode detection circuit, etc.

FIG. 3 shows the rapid short-circuit protection circuit for the output part of the battery charger circuitry of an embodiment of the invention, as part of a battery power supply circuit, connected with a DC output in the main circuit of the circuitry. The rapid short-circuit protection circuit is mainly used for carrying out short-circuit protection on the MOS switch transistors Q27 and Q29 when the output end of the charger is short-circuited, and the working mechanism of the rapid short-circuit protection circuit is as follows:

when short-circuited, the output end VOUT is at a low level, the emitter of the triode Q35 is also at a low level, the base of the triode Q35 is connected with the battery voltage protection control end DIS CTL of the central processing unit, and the collector of the triode Q35 is provided with the voltage VBAT applied by the battery, entering the working state. Once the transistor Q35 starts working, the base voltage of the transistor Q32 is lowered, and the transistor Q32 starts working immediately. At the same time, the triode Q33 is also working, and imposes a current to the diode D29 and the diode D30, respectively, and the grids of the MOS switch transistor Q27 and the MOS switch transistor Q29 are at a high potential and cannot work, so that the effect of protecting the MOS switch transistor Q27 and the MOS switch transistor Q29 is achieved. The diode D30 charges the capacitor C54 after being energized, and when a certain voltage, such as 2V, is reached during charging, a working voltage is provided for the grid of the MOS switch transistor Q34; after the MOS switch transistor Q34 starts working, the voltage of the MOS switch transistor Q31 at the terminal Q31-1, namely at the grid, is lowered by about 2 mS (because the response time is 2 ms for the battery voltage protection control end DIS CTL of the central processing unit to detect the abnormal voltage), and the monitored voltage of the battery voltage protection control end DIS CTL of the central processing unit is lowered, so that the MOS switch transistor Q31 does not work and the protection effect is rendered. The central processing unit receives an abnormal voltage signal of the battery voltage protection control end DIS CTL and immediately sends a control signal for stopping the whole power supply.

In the above process, the MOS switch transistor Q27 and the MOS switch transistor Q29 cannot work because of the high potential at their grids, because the grids of the MOS switch transistor Q27 and the MOS switch transistor Q29 are at high potential when a current is applied to the D29, and at this time, the triode Q33 is turned on, so the grid and source potentials of the MOS switch transistor Q27 and the MOS switch transistor Q29 are substantially equal. In the above process, the MOS switch transistor Q31 is not working because the voltage at the grid of the MOS switch tube, namely at the terminal Q31-1, is lowered.

The foregoing is a further detailed description of the invention in connection with specific/preferred embodiments, and is not to be construed as limiting the invention to such specific embodiments. It will be apparent to those skilled in the art that various substitutions and modifications can be made to the described embodiments without departing from the spirit of the invention, and it is intended that such substitutions and modifications fall within the scope of the invention. Although the present invention and advantages have been described in detail above, it should be understood that various changes, substitutions and alterations can be made herein without departing from the spirit and scope of the invention. Furthermore, the scope of application of the invention is not intended to be limited to the particular embodiments of the process, machine, manufacturing, composition of matter, means, methods and steps described in the description. It is to be understood that further modifications may be made, and this application is intended to cover any variations, applications, or adaptations of the invention following, in general, the principles of the invention, and to include such departures from the present disclosure as come within known or customary practice in the art to which the invention pertains, as may be applied to the essential features hereinbefore set forth, and as are defined in the scope of the appended claims. In addition, although certain preferred embodiments of the invention have been described and specifically exemplified above, it is not intended that the invention be limited to such embodiments, and any such limitations are intended to be encompassed only by the appended claims.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A short-circuit protection circuit for a battery charger, the battery charger comprising a battery power supply circuit, the battery power supply circuit comprising a first MOS switch transistor, a second MOS switch transistor, a third MOS switch transistor and a battery terminal, a drain of the first MOS switch transistor being connected with a voltage output end VOUT of the battery charger, a source of the first MOS switch transistor being connected with a source of the second MOS switch transistor, grids of the first MOS switch transistor and the second MOS switch transistor being coupled to a drain of the third MOS switch transistor, a grid of the third MOS switch transistor being coupled to a battery voltage protection control end of a central processing unit of the battery charger, a source of the third MOS switch transistor being grounded, and the battery terminal being connected into a battery;

wherein the short-circuit protection circuit comprises a first diode, a second diode, a third diode, a first triode, a second triode, a third triode and a fourth MOS switch transistor, wherein the drain of the first MOS switch transistor is connected with a cathode of the first diode, an anode of the first diode is connected with an emitter of the first triode and a collector of the second triode, a base of the first triode is coupled to the battery voltage protection control end of the central processing unit, a collector of the first triode is connected with a base of the second triode, an emitter of the second triode is coupled to a base of the third triode, a collector of the third triode is connected with anodes of the second diode and the third diode, an cathode of the second diode is connected with grids of the second MOS switch transistor and the first MOS switch transistor, a drain of the second MOS switch transistor and an emitter of the third triode are connected with a positive electrode of the battery terminal, a cathode of the third diode is coupled to a grid of the fourth MOS switch transistor, a drain of the fourth MOS switch transistor is connected with a grid of the third MOS switch transistor, and a source of the fourth MOS switch transistor is grounded.

2. The short-circuit protection circuit according to claim 1, wherein the grids of the first MOS switch transistor and the second MOS switch transistor are connected with the drain of the third MOS switch transistor through a second resistor, the grid of the first MOS switch transistor is connected with the source of the first MOS switch transistor through a third resistor, and the grid of the second MOS switch transistor is connected with the source of the second MOS switch transistor through a stabilovolt.

3. The short-circuit protection circuit according to claim 1, wherein the grid of the third MOS switch transistor and the drain of the fourth MOS switch transistor are connected with the battery voltage protection control end of the central processing unit through a first resistor, and the grid of the third MOS switch transistor is connected with the source of the third MOS switch transistor through a fourth resistor.

4. The short-circuit protection circuit according to claim 1, wherein the base of the first triode is connected with the battery voltage protection control end of the central processing unit through a fifth resistor.

5. The short-circuit protection circuit according to claim 1, wherein the base of the second triode is connected with the emitter of the second triode through a sixth resistor, the emitter of the second triode is connected with the base of the third triode through a seventh resistor, and the base of the third triode is connected with the emitter of the third triode through an eighth resistor.

6. The short-circuit protection circuit according to claim 1, wherein the cathode of the third diode is connected with the grid of the fourth MOS switch transistor through a ninth resistor, and is connected with the source of the fourth MOS switch transistor through a first capacitor and a tenth resistor which are connected in parallel.

7. The short-circuit protection circuit according to claim 1, wherein the drain of the second MOS switch transistor and the emitter of the third triode are connected with the positive electrode of the battery terminal through a PTC fuse.

8. A battery charger, comprising a battery power supply circuit, the battery power supply circuit comprising a first MOS switch transistor, a second MOS switch transistor, a third MOS switch transistor and a battery terminal, a drain of the first MOS switch transistor being connected with a voltage output end VOUT, and a source of the first MOS switch transistor being connected with a source of the second MOS switch transistor, grids of the first MOS switch transistor and the second MOS switch transistor being coupled to a drain of the third MOS switch transistor, a grid of the third MOS switch transistor being coupled to a battery voltage protection control end of a central processing unit, a source of the third MOS switch transistor being grounded, and the battery terminal being connected into a battery;

wherein the battery charger further comprises the short-circuit protection circuit according to claim 1.

9. The battery charger according to claim 8, wherein the battery charger is a lead-acid battery charger.

* * * * *